United States Patent
Chadha

(10) Patent No.: US 10,903,802 B2
(45) Date of Patent: Jan. 26, 2021

(54) ANALOG BASED SPEAKER THERMAL PROTECTION IN CLASS-D AMPLIFIERS

(71) Applicant: TEXAS INSTRUMENTS INCORPORATED, Dallas, TX (US)

(72) Inventor: Jasjot Singh Chadha, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/553,369

(22) Filed: Aug. 28, 2019

(65) Prior Publication Data

US 2020/0252034 A1  Aug. 6, 2020

(30) Foreign Application Priority Data

Feb. 1, 2019  (IN) .............................. 201941003984

(51) Int. Cl.
| | |
|---|---|
| H03F 1/52 | (2006.01) |
| H04R 3/00 | (2006.01) |
| H03F 3/45 | (2006.01) |
| H03G 3/30 | (2006.01) |
| H03F 3/217 | (2006.01) |

(52) U.S. Cl.
CPC .............. *H03F 1/52* (2013.01); *H03F 3/217* (2013.01); *H03F 3/45* (2013.01); *H03G 3/3005* (2013.01); *H04R 3/007* (2013.01); H03F 2200/03 (2013.01); H03F 2203/45151 (2013.01); H03F 2203/45528 (2013.01)

(58) Field of Classification Search
CPC .......... H03G 3/20; H03G 3/3005; H03G 3/32; H04R 2430/01; H04R 3/00; H03F 3/217

USPC .... 381/108, 107, 121; 330/207 A, 251, 254, 330/278
See application file for complete search history.

(56) References Cited

U.S. PATENT DOCUMENTS

| | | | | |
|---|---|---|---|---|
| 4,180,706 | A | * 12/1979 | Bakgaard | H04R 3/002 381/96 |
| 5,821,736 | A | 10/1998 | Yeon | |
| 9,626,950 | B2 * | 4/2017 | McNutt | G10K 11/002 |
| 10,531,193 | B2 * | 1/2020 | Ding | H04R 29/001 |

(Continued)

FOREIGN PATENT DOCUMENTS

JP  57109014  7/1982

OTHER PUBLICATIONS

International Search Report in corresponding PCT Application No. PCT/US2020/016076, dated Apr. 23, 2020 (2 pages).

*Primary Examiner* — Alexander Krzystan
(74) *Attorney, Agent, or Firm* — John R. Pessetto; Charles A. Brill; Frank D. Cimino

(57) ABSTRACT

A circuit comprises a sensing resistor with a resistance Rs, a first amplifier circuit with a first gain factor G, a second amplifier circuit with a second gain factor (1/A), a third amplifier circuit, a current mirror, a buffer, and a peak voltage detector. The first amplifier circuit is coupled to the sensing resistor at a first node and a second node and to the second amplifier circuit, which is further coupled to the current mirror. The buffer is coupled to the current mirror and to the third amplifier circuit, which is further coupled to the peak voltage detector and configured to receive a voltage across a load and a voltage on a ground node. In some implementations, the load is a speaker. In some implementations, a filter is coupled between the first and the second amplifier circuits.

18 Claims, 2 Drawing Sheets

(56) References Cited

U.S. PATENT DOCUMENTS

| | | |
|---|---|---|
| 2014/0184314 A1 | 7/2014 | Takahashi et al. |
| 2017/0094408 A1 | 3/2017 | Napoli et al. |
| 2017/0272045 A1* | 9/2017 | Chadha ................ H04R 29/001 |
| 2018/0212570 A1* | 7/2018 | Zhu ....................... H03F 3/2171 |
| 2018/0358943 A1* | 12/2018 | Chang .................. H03G 3/3005 |

* cited by examiner

ANALOG BASED SPEAKER THERMAL PROTECTION IN CLASS-D AMPLIFIERS

RELATED APPLICATION

This application claims priority to Indian Provisional Application No. 201941003984, filed Feb. 1, 2019, which is hereby incorporated by reference.

BACKGROUND

Speakers are often overdriven in order to obtain a desired loudness for an audio output signal. However, overdriving a speaker can cause the speaker to overheat and cause permanent damage to the speaker. Overheating a speaker can cause a change in the shape of the speaker's diaphragm; which distorts audio signals output by the speaker. Overheating the speaker can also melt components within the speaker, including glue holding a voice coil to a speaker driver, solder connecting an amplifier to the speaker, and insulation on the voice coil. Melting the insulation on the voice coil causes the voice coil to short and limit the loudness of the speaker, lowering the resistance of the speaker and further increasing the speaker temperature.

These mechanical failures within a speaker due to temperature increases can cause the speaker to fail. In order to reduce the likelihood of these mechanical failures, the power applied to the speaker is controlled to reduce overheating. Some audio amplifier systems detect speaker temperature using current and voltage sensors, which detect the current through and voltage across a connected speaker. The sensed current and voltage are provided to a digital signal processor via a sigma-delta analog-to-digital converter (ADC), which determines the speaker resistance and converts the determined resistance into a speaker temperature based on the speaker's thermal characteristics. However, the ADCs, current and voltage sensors, and digital signal processors are area intensive on a semiconductor die.

Some audio amplifier systems rely on feed-forward thermal protection for connected speakers. The audio output signal peak values are detected. In response to the signal level crossing a pre-defined threshold, a multi-stage automatic gain control circuit reduces the output signal power in a defined sequence, which ensures the speaker is able to play high power signals for a short period of time but not so long as to heat the speaker. However, the multi-stage automatic gain control circuit implements conservative thresholds for the audio output signal because the actual speaker temperature is not sensed, and the audio amplifier system relies on feed-forward protection for the speaker. The conservative thresholds lead to lower maximum allowed power for the audio amplifier system.

SUMMARY

A circuit comprises a sensing resistor with a resistance Rs, a first amplifier circuit with a first gain factor G, a second amplifier circuit with a second gain factor (1/A), a third amplifier circuit, a current mirror, a buffer, and a peak voltage detector. The first amplifier circuit is coupled to the sensing resistor at a first node and a second node and to the second amplifier circuit, which is further coupled to the current mirror. The buffer is coupled to the current mirror and to the third amplifier circuit, which is further coupled to the peak voltage detector and configured to receive a voltage across a load and a voltage on a ground node. In some implementations, the load is a speaker. In some implementations, a filter is coupled between the first and the second amplifier circuits.

In some examples, the first amplifier circuit comprises a first input coupled to the first node, a second input coupled to the second node, and a first output coupled to the second amplifier circuit. The first amplifier circuit includes a first differential amplifier having a first negative input, a first positive input, and the first output. A first and a second resistor have a first resistance. The first resistor is coupled between the first input and the first negative input. The second resistor is coupled between the second input and the first positive input. A third and a fourth resistor have a second resistance, such that a ratio of the first resistance to the second resistance is the first gain factor G. The third resistor is coupled between a supply voltage node and the first positive input. The fourth resistor is coupled between the first negative input and the first output.

In some examples, the second amplifier circuit includes a second differential amplifier having a second negative input coupled to the first amplifier circuit and a second positive input and a second output coupled to the current mirror. The current mirror includes a first and a second transistor and a fifth and a sixth resistor. The first transistor has a first control input and a first current terminal coupled to the second amplifier circuit, and a second current terminal coupled to a supply voltage node. The fifth resistor is coupled to the first current terminal and the second amplifier circuit. The second transistor has a second control input coupled to the second amplifier circuit, a third current terminal coupled to the supply voltage node, and a fourth current terminal coupled to the buffer. The sixth resistor is coupled to the fourth current terminal and to the buffer. The fifth resistor has a resistance (A*Rs) and the sixth resistor has a resistance (A*Rload/G), where Rload represents an initial resistance of the load.

In some examples, the third amplifier circuit includes a third differential amplifier and a seventh, an eighth, a ninth, a tenth, an eleventh, and a twelfth resistor having a third resistance. The third differential amplifier has a third negative input, a third positive input, and a third output coupled to the peak voltage detector. The seventh resistor is coupled to the third negative input and to the second node, and the eighth resistor is coupled to the third negative input and to the ground node. The ninth resistor is coupled to the third positive input and to the buffer, and the tenth resistor is coupled to the third positive input and to a third node, wherein the load is configured to be coupled between the second and third nodes. The eleventh resistor is coupled to the third negative input and to the third output, and the twelfth resistor is coupled to the third positive input and to a supply voltage node.

In some implementations, the circuit is included in a system comprising a gain control circuit, a class-D amplifier, and a power limiter circuit. The gain control circuit receives an input signal and applies a gain factor to the input signal. The class-D amplifier is coupled to the gain control circuit and configured to be coupled to the load. The power limiter circuit is coupled to the circuit and configured to decrease the gain factor. In some examples, a filter is coupled between the circuit and the power limiter circuit. The power limiter circuit includes a reference voltage generator and a differential amplifier. The reference voltage generator is coupled to the circuit and is configured to generate a reference voltage using an output of the circuit and a predetermined threshold difference in resistance for the load. The differential amplifier has a positive input coupled to the reference voltage generator, a negative input coupled to the circuit, and an output coupled to the gain control circuit.

BRIEF DESCRIPTION OF THE DRAWINGS

For a detailed description of various examples, reference will now be made to the accompanying drawings in which.

DETAILED DESCRIPTION

Figure 1:
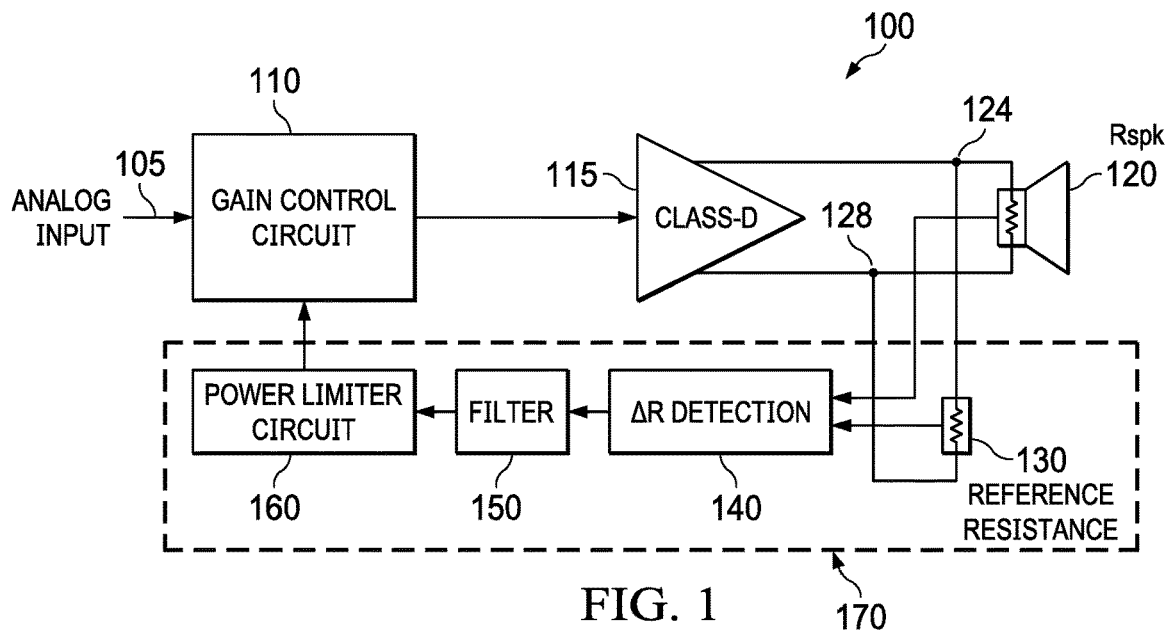
FIG. 1 illustrates, in block diagram form, an example feedback system for thermal protection of a speaker.

The disclosed thermal protection circuits for audio amplifier systems are analog circuits and occupy less area on a semiconductor die than a thermal protection circuit relying on digital signal processing and the associated ADCs. The example thermal protection circuits also determine a connected speaker's temperature and allow the audio amplifier system to implement less conservative audio output signal thresholds and increase the maximum allowed power compared to audio amplifier systems relying on feed-forward thermal protection.

An example thermal protection circuit compares an output load current to a known reference current. The reference current is calibrated to match the speaker's resistance at a known temperature, referred to herein as the speaker's resistance at time t0 under resting conditions and which can be determined at the time of manufacture. A difference between the two currents results from a connected speaker's change in resistance due to an increase in speaker temperature caused by outputting an audio signal or by increases in the ambient temperature. As the connected speaker heats up, the current difference increases and is filtered to correspond to the speaker's thermal time constant. A difference voltage generated using the current difference is compared against threshold voltages representing acceptable and unacceptable changes in speaker resistance due to acceptable or unacceptable speaker temperatures. The class-D gain is reduced in response to a determination that the speaker temperature is unacceptable, and the gain is increased in response to the speaker temperature returning to an acceptable range. The decrease in gain reduces the output power of the speaker and helps protect the speaker from thermal damage.

An example thermal protection circuit includes a circuit configured to determine a change in resistance of a connected load. This circuit, a ΔR detection circuit, includes a sensing resistor coupled between the class-D amplifier and the speaker, three amplifier circuits, a buffer, a current mirror, and a peak voltage detector. The first amplifier circuit is coupled to the sensing resistor and amplifies a voltage across the sensing resistor by a first gain factor G. The second amplifier circuit is coupled to the first amplifier circuit and to the current mirror and generates an output current by buffering the first amplifier circuit output onto a resistor matched to the sensing resistor. The output current generated by the current mirror can have a second gain factor (1/A). In some implementations, a filter is coupled between the first amplifier circuit and the second amplifier circuit and filters the output of the first amplifier circuit to a pilot tone frequency added to the audio input signal.

The current mirror generates a current based on the output of the second amplifier circuit and has a current mirror ratio based on the first and second gain factors. The current is applied to a reference resistor calibrated to match the speaker's resistance at time t0 under resting conditions. The buffer is coupled to the output of the current mirror and the third amplifier circuit, which outputs a voltage difference between the reference voltage, generated by the output current of the current mirror and the reference resistor, and the voltage across the speaker. The voltage difference is provided to the peak voltage detector, which outputs a voltage based on the peak current for the load and the difference in resistance for the speaker due to temperature changes.

FIG. 1 illustrates, in block diagram form, an example feedback system 170 for thermal protection of a speaker system 100. Speaker system 100 includes a gain control circuit 110, a class-D amplifier 115, a speaker 120, and feedback system 170. Feedback system 170 includes a reference resistor 130, a difference in resistance ΔR detection circuit 140, a filter 150, and a power limiter circuit 160. An analog input signal 105 is input to gain control circuit 110, which is coupled to class-D amplifier 115. Class-D amplifier 115 is coupled to speaker 120 at nodes 124 and 128. Speaker 120 has a resistance Rspk, which is temperature-dependent.

In feedback system 170, reference resistor 130 is coupled in parallel with speaker 120 at nodes 124 and 128. The currents through Rspk and reference resistor 130 are provided to ΔR detection circuit 140, which determines a difference between Rspk and reference resistor 130. The difference between Rspk and reference resistor 130 is provided to filter 150, which filters the output signal to a pilot tone. The pilot tone can be added to analog input signal 105, and in some examples is approximately 60 Hertz (Hz) and less than 10 milliwatts (mW) in output power. In some examples, filter 150 is a low pass filter. In some examples, filter 150 is a bandpass filter centered around the pilot tone frequency.

By filtering the signal to the pilot tone, feedback system 170 can simplify other components to detect only the pilot tone, rather than all frequencies that might be output by speaker 120. In this example, filter 150 is coupled between ΔR detection circuit 140 and power limiter 160, but in other implementations filter 150 is included in ΔR detection circuit 140. The output of filter 150 is provided to power limiter circuit 160, which compares the difference between Rspk and reference resistor 130 to one or more threshold differences in resistance and limits the gain applied to analog input signal 105 by gain control circuit 110 based on the comparison.

In some implementations, gain control circuit 110 implements a fast attack and a slow release, to improve audio output quality. In the fast attack, gain control circuit 110 attenuates gain applied to analog input signal 105 quickly. In the slow release, gain control circuit 110 delays any increases in gain for a predetermined period of time before implementing the gain increase. In some examples, the fast attack and slow release implemented by gain control circuit 110 is bypassed and a delay is caused by filter 150, which modulates the gain increase and decrease and can be adjusted to improve audio output quality.

Figure 2:
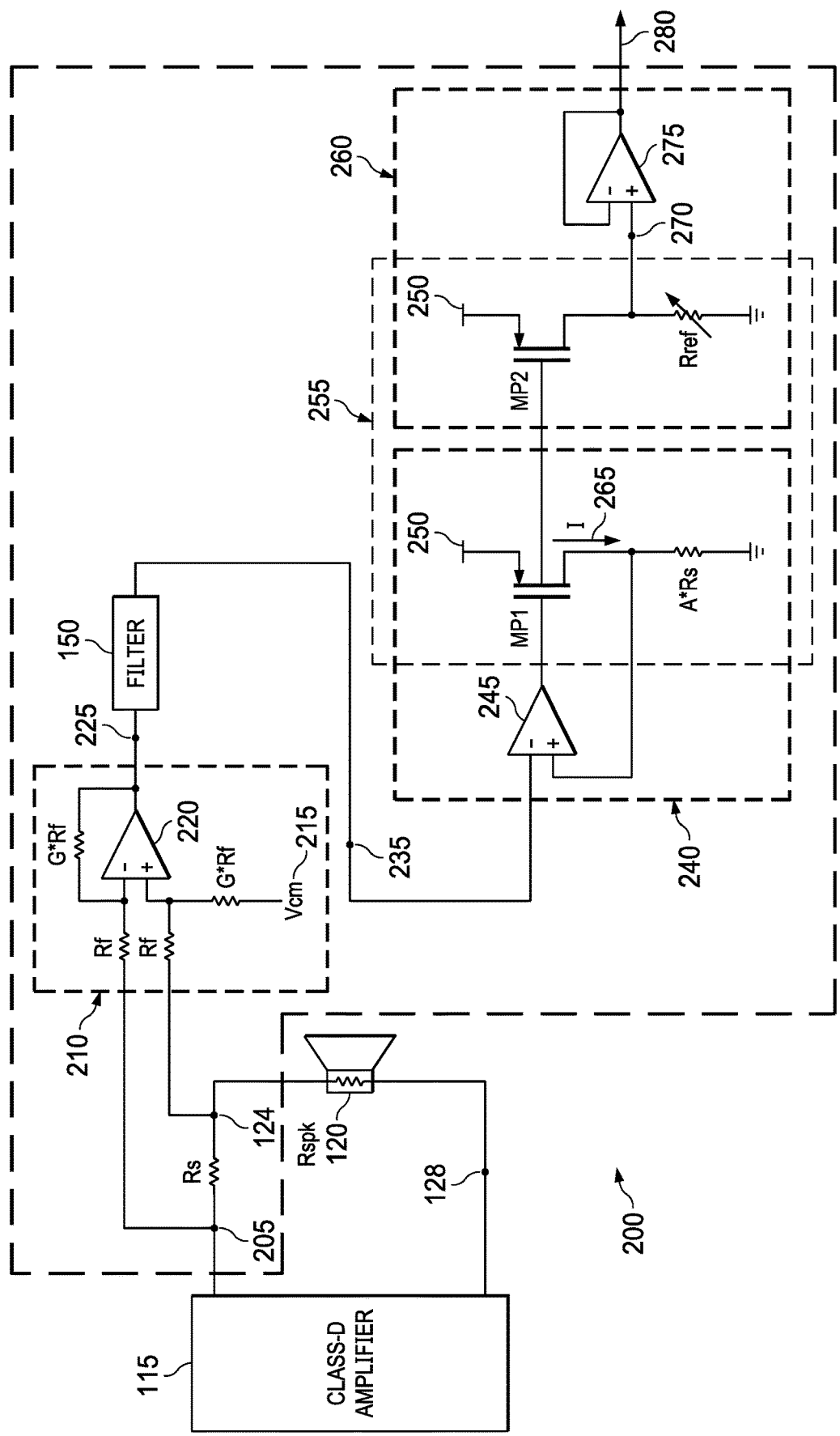
FIG. 2 illustrates an example circuit for determining a current through a speaker and the resulting voltage on a reference resistor.

FIG. 2 illustrates an example circuit 200 for determining a current through a speaker and the resulting voltage on a reference resistor. For ease of explanation, example circuit 200 is described with reference to speaker system 100 in FIG. 1. Example circuit 200 may comprise part of ΔR detection circuit 140, and includes a sensing resistor Rs, amplifiers 210 and 240, and a current source and buffer circuit 260. Sensing resistor Rs is coupled between class-D amplifier 115 and speaker 120, and has a small resistance, for example 60 milliohms (ms)). The load current IL through sensing resistor Rs and speaker 120 is provided to amplifier 210, which amplifies the voltage across the sensing resistor Rs by a factor G.

In this example, amplifier 210 includes a differential amplifier 220, two resistors Rf, and two resistors G*Rf. One resistor Rf is coupled to sensing resistor Rs and to class-D amplifier 115 at node 205, and to a negative input of differential amplifier 220. The second resistor Rf is coupled to sensing resistor Rs and to speaker 120 at node 124, and to a positive input of differential amplifier 220. One resistor G*Rf is coupled to a voltage source Vcm 215 and to the positive input of differential amplifier 220. The second resistor G*Rf is coupled to the negative input of differential amplifier 220 and to the output of differential amplifier 220.

The signal 225 output from differential amplifier 220 is the current IL multiplied by both the resistance of sensing resistor Rs and the amplifier gain G, IL*Rs*G. The signal 225 is provided to filter 150 in this example. By filtering signal 225 to the pilot tone early in the signal chain, amplifier 240 and circuit 260 can be simplified to detect fewer frequencies than the full range of frequencies output by speaker 120. Filter 150 also allows circuit 200 to track the change in Rspk at a rate at which the temperature of speaker 120 can increase, based on a thermal time constant of speaker 120.

The filtered output signal 235 is provided to amplifier 240, which extracts the load current IL by dividing signal 235 over a copy of sensing resistor Rs and amplifies it by a factor (1/A). Amplifier 240 includes a differential amplifier 245, a resistor A*Rs, and a p-type metal oxide semiconductor field effect transistor (PMOS) MP1. In other examples, MP1 can be implemented as a n-type metal oxide semiconductor field effect transistor (NMOS) or a bipolar junction transistor (BJT). MP1 has a control input and a pair of current terminals. In an implementation in which MP1 is a BJT, the control input is the base of the transistor and the current terminals are the transistor's collector and emitter. In the case of an NMOS or PMOS device, the control input is the transistor's gate and the current terminals are the transistor's source and drain.

Differential amplifier 245 receives signal 235 at a negative input. A gate terminal of MP1 is coupled to the output of differential amplifier 245, and a source terminal of MP1 is coupled to a supply voltage node 250. A drain terminal of MP1 is coupled to the resistor A*Rs and a positive input of differential amplifier 245. Resistor A*Rs is further coupled to a ground node. A current I 265 through MP1 is the load current IL multiplied by the gain factor G and divided by the gain factor A, (IL*G/A). The current I 265 is mirrored through a second PMOS MP2 in circuit 260, which also includes a reference resistor Rref and a buffer 275. A gate terminal of MP2 is coupled is coupled to the output of differential amplifier 245, and a source terminal of MP2 is coupled to a supply voltage node 250. A drain terminal of MP2 is coupled to reference resistor Rref and an input of buffer 275. MP1, MP2, resistor A*Rs, and reference resistor Rref comprise a current mirror 255.

A resistance of reference resistor Rref is chosen to represent the resistance of Rspk at some initial time t0 at an ambient environmental temperature, before it has been heated from use, and to remove the gain factors G and A. The resistance of reference resistor Rref is represented as:

$$Rref = \frac{A*Rspk(t0)}{G}.$$

In some implementations, the resistance of Rref can be set by a user based on the particular speaker 120 coupled to the audio amplifier system. In some implementations, the resistance of Rref can be set during manufacture of the audio system including the semiconductor die and audio amplifier system based on the particular speaker 120 included. The signal 270 input to buffer 275 is represented as:

$$\frac{IL*G*Rref}{A} = \frac{IL*G}{A}\left(\frac{A*Rspk(t0)}{G}\right) = IL*Rspk(t0)$$

which is output from buffer 275 as buffered output 280.

Figure 3:
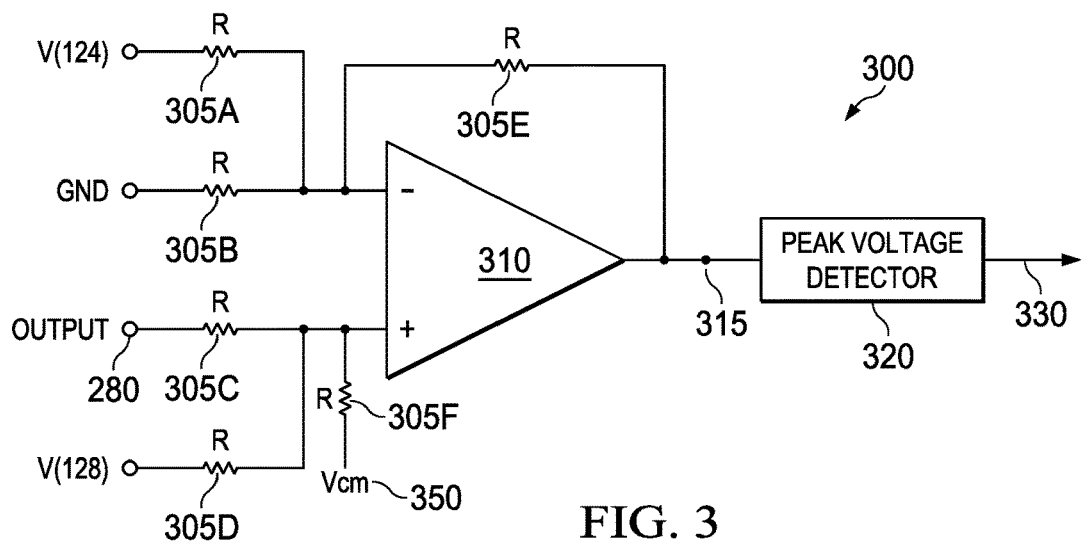
FIG. 3 illustrates an example circuit for determining a difference in a speaker's real time resistance with respect to a known reference resistance, corresponding to a resistance of the speaker at some time t0 under resting conditions.

FIG. 3 illustrates an example circuit 300 for determining a difference in a speaker's resistance. For ease of explanation, example circuit 300 is described with reference to circuit 200 in FIG. 2 and speaker system 100 in FIG. 1. Example circuit 300 may comprise part of ΔR detection circuit 140, and includes a differential amplifier 310, a peak voltage detector 320, and six resistors: R 305A, R 305B, R 305C, R 305D, R 305E, and R 305F. R 305A and 305B are coupled to a negative input of differential amplifier 310. R 305A is further configured to receive a voltage at node 124, and R 305B is further coupled to a ground node.

R 305C and 305D are coupled to a positive input of different amplifier 310. R 305C is further configured to receive buffered output 280, and R 305D is further configured to receive a voltage at node 128. R 305D is coupled to the negative input of differential amplifier 310 and to the output of differential amplifier 310. R 305E is coupled to the negative input and the output of differential amplifier 310. R 305F is coupled to the positive input of differential amplifier 310 and to a voltage source Vcm 350, which corresponds to the voltage source Vcm 215 shown in FIG. 2. An output 315 of differential amplifier 310 is a function of the difference in resistance of Rspk due to temperature changes, which can be represented by IL*(Rspk−Rspk(t0)), or IL*ΔRspk. The output 315 is input to peak voltage detector 320, which converts output 315 to a DC signal 330 based on the peak signal Ipk of the known pilot tone amplitude added to the analog input signal 105. Output signal 330 is represented as Ipk*ΔRspk.

Figure 4:
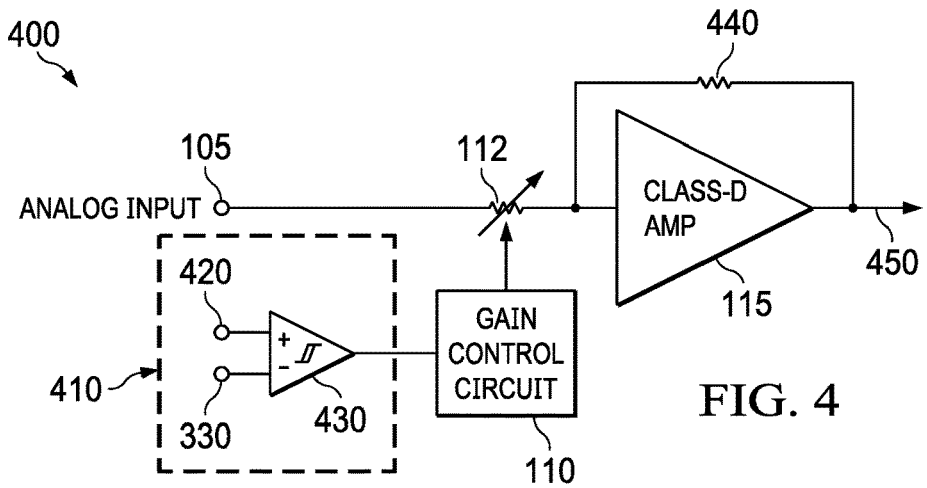
FIG. 4 illustrates an example circuit for determining an adjustment to a speaker's gain based on a difference in the speaker's real time resistance with respect to a known reference resistance, corresponding to a resistance of the speaker at some time t0 under resting conditions.

FIG. 4 illustrates, in block diagram form, an example power limiter circuit and an example gain control circuit for determining an adjustment to a speaker's gain based on a difference in the speaker's resistance. For ease of explanation, FIG. 4 is described with reference to circuit 300 in FIG. 3 and speaker system 100 in FIG. 1. Example power limiter circuit 410 includes a differential amplifier 430, which receives output signal 330 from peak voltage detector 320 in circuit 300 at a negative input. Differential amplifier 430 receives a signal 420 at a positive input. Signal 420 represents a threshold variation in resistance threshold(ΔRspk) of speaker 120, above which the gain applied to analog input signal 105 is limited by gain control circuit 110 to decrease the temperature of speaker 120. Signal 420 can be represented by Ipk*threshold(ΔRspk), which is generated using the peak signal Ipk to track the load current profile of the speaker.

In response to output signal Ipk*ΔRspk 330 being greater than threshold signal Ipk*threshold(ΔRspk) 420, gain control circuit 110 reduces the gain applied to analog input signal 105 by changing a resistance of variable resistor 112, which is included in gain control circuit 110 in this example. Resistor 440 is coupled to the input and the output of class-D amplifier 115 and, in combination with variable resistor 112, sets a gain factor for class-D amplifier 115 and analog input 105. The output of class-D amplifier 115 is output signal 450, which represents the signal with modified gain provided to speaker 120 to decrease the power used by speaker 120 and, by extension, the temperature of speaker 120. As described previously herein with reference to FIG. 1, gain control circuit 110 can implement a fast attack and a slow release to improve audio artifacts.

In some examples, power limiter 410 implements multiple threshold variations in the resistance of speaker 120, and gain control circuit 110 implements different changes in gain and the resistance of variable resistor 112 based on the multiple threshold variations. For example, power limiter 410 implements a first threshold variation threshold1 (ΔRspk) and a second threshold variation threshold2 (ΔRspk), where the first threshold represents a first, smaller difference in resistance and the second threshold represents a second, larger difference in resistance. In response to output signal 330 being greater than the first threshold but smaller than the second threshold, gain control circuit 110 decreases the gain by a first, smaller amount compared to the larger gain decrease in response to output signal 330 being greater than the second threshold.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a sensing resistor coupled between a first terminal and a second terminal, wherein the sensing resistor has a resistance Rs;
   a first amplifier circuit coupled to the sensing resistor at the first and second terminals, wherein the first amplifier circuit has a first gain factor G;
   a second amplifier circuit coupled to the first amplifier circuit and to a current mirror, wherein the second amplifier circuit has a second gain factor (1/A);
   a buffer coupled to the current mirror;
   a third amplifier circuit coupled to the buffer and configured to receive a voltage across a load and a voltage on a ground terminal; and
   a peak voltage detector coupled to the third amplifier circuit.

2. The circuit of claim 1, wherein the load comprises a speaker.

3. The circuit of claim 1, wherein the first amplifier circuit comprises a first input, a second input, and a first output, wherein the first input is coupled to the first terminal, wherein the second input is coupled to the second terminal, and the second amplifier circuit is coupled to the first output.

4. The circuit of claim 3, wherein the first amplifier circuit further comprises:
   a first differential amplifier having a first negative input, a first positive input, and a first output;
   a first resistor coupled between the first input and the first negative input;
   a second resistor coupled between the second input and the first positive input, wherein the first and the second resistors have a first resistance;
   a third resistor coupled between a supply voltage terminal and the first positive input; and
   a fourth resistor coupled between the first negative input and the first output, wherein the third and the fourth resistors have a second resistance, and wherein a ratio of the first resistance to the second resistance is the first gain factor G.

5. The circuit of claim 1, wherein the second amplifier circuit comprises a second differential amplifier having:
   a second negative input coupled to the first amplifier circuit; and
   a second positive input and a second output coupled to the current mirror.

6. The circuit of claim 1, wherein the current mirror comprises:
   a first transistor having a first control input and a first current terminal coupled to the second amplifier circuit, the first transistor further having a second current terminal coupled to a supply voltage terminal;
   a fifth resistor coupled to the first current terminal and the second amplifier circuit;
   a second transistor having a second control input coupled to the second amplifier circuit, a third current terminal coupled to the supply voltage terminal, and a fourth current terminal coupled to the buffer; and
   a sixth resistor coupled to the fourth current terminal and the buffer.

7. The circuit of claim 6, wherein the fifth resistor has a resistance (A*Rs), and wherein the sixth resistor has a resistance (A*Rload/G), where Rload represents an initial resistance of the load.

8. The circuit of claim 1, wherein the third amplifier circuit comprises:
   a third differential amplifier having a third negative input, a third positive input, and a third output, wherein the third output is coupled to the peak voltage detector; and
   a seventh, an eighth, a ninth, a tenth, an eleventh, and a twelfth resistor having a third resistance, wherein:
      the seventh resistor is coupled to the third negative input and the second terminal;
      the eighth resistor is coupled to the third negative input and the ground terminal;
      the ninth resistor is coupled to the third positive input and the buffer;
      the tenth resistor is coupled to the third positive input and a third terminal, wherein the second and third terminals are configured to be coupled to the load;
      the eleventh resistor is coupled to the third negative input and the third output; and
      the twelfth resistor is coupled to the third positive input and a supply voltage terminal.

9. The circuit of claim 1, further comprising a filter coupled between the first amplifier circuit and the second amplifier circuit.

10. A system, comprising:
- a gain control circuit configured to receive an input signal and apply a gain factor;
- a class-D amplifier coupled to the gain control circuit and configured to be coupled to a load;
- a ΔR detection circuit coupled to the class-D amplifier and to a reference resistor and configured to determine a difference in resistance between the load and the reference resistor, wherein the reference resistor has a resistance equal to an initial resistance of the load; and
- a power limiter circuit coupled to the ΔR detection circuit and configured to decrease the pain factor;
- wherein the ΔR detection circuit comprises:
  - a sensing resistor coupled to the class-D amplifier and configured to be coupled to the load, wherein the sensing resistor has a resistance Rs;
  - a first amplifier circuit coupled to the sensing resistor, wherein the first amplifier circuit has a first gain factor G;
  - a second amplifier circuit coupled to the first amplifier circuit and a current mirror, wherein the second amplifier circuit has a second gain factor (1/A);
  - a buffer coupled to the current mirror;
  - a third amplifier circuit coupled to the buffer, the sensing resistor, a ground terminal, and the reference resistor, wherein the third amplifier circuit is configured to be coupled to the load; and
  - a peak voltage detector coupled to the third amplifier circuit.

11. The system of claim 10, wherein the first amplifier circuit comprises a first input, a second input, and a first output, wherein the first input is coupled to the sensing resistor, wherein the second input is coupled to the sensing resistor and configured to be coupled to the load, and wherein the second amplifier circuit is coupled to the first output.

12. The system of claim 11, wherein the first amplifier circuit further comprises:
- a first differential amplifier having a first negative input, a first positive input, and the first output;
- a first resistor coupled between the first input and the first negative input;
- a second resistor coupled between the second input and the first positive input, wherein the first and the second resistors have a first resistance;
- a third resistor coupled between a supply voltage terminal and the first positive input; and
- a fourth resistor coupled between the first negative input and the first output, wherein the third and the fourth resistors have a second resistance, and wherein a ratio of the first resistance to the second resistance is the first gain factor G.

13. The system of claim 10, wherein the second amplifier circuit comprises a second differential amplifier having:
- a second negative input coupled to the first amplifier circuit; and
- a second positive input and a second output coupled to the current mirror.

14. The system of claim 10, wherein the current mirror comprises:
- a first transistor having a first control input and a first current terminal coupled to the second amplifier circuit, the first transistor further having a second current terminal coupled to a supply voltage terminal;
- a fifth resistor coupled to the first current terminal and the second amplifier circuit; and
- a second transistor having a second control input coupled to the second amplifier circuit, a third current terminal coupled to the supply voltage terminal, and a fourth current terminal coupled to the buffer and the reference resistor.

15. The system of claim 14, wherein the fifth resistor has a resistance (A*Rs), and wherein the reference resistor has a resistance (A*Rload/G), where Rload represents the initial resistance of the load.

16. The system of claim 10, wherein the third amplifier circuit comprises:
- a third differential amplifier having a third negative input, a third positive input, and a third output, wherein the third output is coupled to the peak voltage detector; and
- a seventh, an eighth, a ninth, a tenth, an eleventh, and a twelfth resistor having a third resistance, wherein:
  - the seventh resistor is coupled to the third negative input and the sensing resistor, wherein the seventh resistor is configured to be coupled to the load;
  - the eighth resistor is coupled to the third negative input and the ground terminal;
  - the ninth resistor is coupled to the third positive input and the buffer;
  - the tenth resistor is coupled to the third positive input and configured to be coupled to the load;
  - the eleventh resistor is coupled to the third negative input and the third output; and
  - the twelfth resistor is coupled to the third positive input and a supply voltage terminal.

17. The system of claim 10, further comprising a filter coupled between the first and the second amplifier circuits.

18. A system, comprising:
- a gain control circuit configured to receive an input signal and apply a gain factor;
- a class-D amplifier coupled to the gain control circuit and configured to be coupled to a load;
- a ΔR detection circuit coupled to the class-D amplifier and to a reference resistor and configured to determine a difference in resistance between the load and the reference resistor, wherein the reference resistor has a resistance equal to an initial resistance of the load; and
- a power limiter circuit coupled to the ΔR detection circuit and configured to decrease the gain factor;
- wherein the power limiter circuit comprises:
  - a reference voltage generator coupled to the ΔR detection circuit and configured to generate a reference voltage using an output of the ΔR detection circuit and a threshold difference in resistance for the load; and
  - a differential amplifier having a positive input coupled to the reference voltage generator, a negative input coupled to the ΔR detection circuit, and an output coupled to the gain control circuit.

* * * * *